United States Patent [19]
Cheng et al.

[11] Patent Number: 5,506,788
[45] Date of Patent: Apr. 9, 1996

[54] SIMILARITY-EXTRACTION FORCE-ORIENTED FLOOR PLANNER

[75] Inventors: Eric C. Cheng, Milpitas; Ching-Yen Ho, Saratoga, both of Calif.

[73] Assignee: LSI Logic Corporation, Milpitas, Calif.

[21] Appl. No.: 180,731

[22] Filed: Jan. 13, 1994

[51] Int. Cl.$^6$ ............................................. H01L 21/77
[52] U.S. Cl. ........................ 364/491; 364/488; 364/490
[58] Field of Search .................................. 364/488, 489, 364/490, 491, 578

[56] References Cited

U.S. PATENT DOCUMENTS

| | | | |
|---|---|---|---|
| 4,918,614 | 4/1990 | Modarres et al. | 364/490 |
| 4,967,367 | 10/1990 | Piednoir | 364/489 |
| 5,237,514 | 8/1993 | Curtin | 364/490 |
| 5,295,088 | 3/1994 | Hartoog et al. | 364/578 |
| 5,309,370 | 5/1994 | Wong | 364/490 |
| 5,349,542 | 9/1994 | Brasen et al. | 364/578 |
| 5,377,125 | 12/1994 | Hui et al. | 364/491 |
| 5,398,195 | 5/1995 | Kim | 364/491 |

OTHER PUBLICATIONS

W. K. Luk, A. A. Dean, "Multi-stack Optimation for Data--Path Chip (Microprocessor) Layout", IEEE Proc. of Design Automation Conf., 1989, pp. 110–115.
M. Hirsch, D. Siewiorek, "Automatically Extracting Structure From A Logical Design", IEEE Proc. of Int. Cof. on CAD, 1988, pp. 456–459.
G. Odawanre, T. Haraide, O. Nishina, "Partitioning and Placement Technique for CMOS Gate Array", IEEE Transactions, May 1987, vol. CAD6, No. 3, pp. 335–363.

*Primary Examiner*—Kevin J. Teska
*Assistant Examiner*—Russell W. Frejd
*Attorney, Agent, or Firm*—Poms, Smith, Lande & Rose

[57] ABSTRACT

A method of making, including a method of floorplanning, an integrated circuit includes the separation of electrical logic function cells of the integrated circuit into sets or macros of data path cells, each of which evidence a high level of similarity or repetitiveness in the integrated circuit, and into sets of random logic cells, which each are connected to data path cells but which do not meet topological and connectivity criteria for the data path cells. The data path cells are iteratively sorted according to connectivity requirements and are initially placed on a provisional floor plan of the integrated circuit in a cell-space matrix of rows and columns, the rows being of substantially uniform width to accommodate functional modules of the data path cells, and the rows being of variably height to cooperatively define the spaces of the cell-space matrix. The random logic cells are also iteratively sorted according to connectivety requirements of the integrated circuit and are placed over the data path cells as a provisional overlay of the random logic cells, which are then fitted into any open spaces of the cell-space matrix, and are then inserted into either new rows or new columns of the matrix according to a shape-measuring of the overlay of random logic cells.

28 Claims, 6 Drawing Sheets

| DESIGN: FIFO<br>CELLS: 776 (EXTRACTED = 512)<br>NETS: 2408 | | SLICE NOS.: 8<br>COLUMN NOS.: 16<br>CELL AREA/MODULE AREA = 0.65<br>SIZE: 336 × 1345 GRIDS | |
|---|---|---|---|
| SCHEMES | OPEN NETS CHR/CUR | WIRE LENGTH TOTAL/SLICE [MIN-MAX] | CPU TIME |
| SEFOP | 50/3 | 824132.2/[70125.4-71023.3] | 15 |
| GD → SA | 224/3 | 834652.4/[62903.1-79752.7] | 9144 |
| MC → SA | 510/123 | 862343.8/[67063.1-76592.5] | 7405 |
| GD | 865/507 | 846824.3/[61972.8-77354.2] | 30 |

Fig.11

| DESIGN: FMU<br>CELLS: 1880 (EXTRACTED = 1880)<br>NETS: 2266 | | SLICE NOS.: 56,52<br>COLUMN NOS.: 56<br>CELL AREA/MODULE AREA = 0.58<br>SIZE: 1105 × 334 GRIDS | |
|---|---|---|---|
| SCHEMES | OPEN NETS CHR/CUR | WIRE LENGTH TOTAL/SLICE [MIN-MAX] | CPU TIME |
| SEFOP | 183/87 | 926528.1/[16521.2-16743.2] | 25 |
| GD → SA | 634/407 | 910828.3/[12653.1-20875.2] | 6123 |
| MC → SA | 833/449 | 1149693.0/[17823.5-22635.2] | 6438 |
| GD | 1094/912 | 986353.7/[16947.2-25963.8] | 64 |

Fig.12

| DESIGN: ICVP<br>CELLS: 274 (EXTRACTED = 112)<br>NETS: 394 | | SLICE NOS.: 16,14<br>COLUMN NOS.: 16<br>CELL AREA/MODULE AREA = 0.64<br>SIZE: 240 × 227 GRIDS | |
|---|---|---|---|
| SCHEMES | OPEN NETS CHR/CUR | WIRE LENGTH TOTAL/SLICE [MIN-MAX] | CPU TIME |
| SEFOP | 62/11 | 110264.6/[5186.2-5239.1] | 6 |
| GD → SA | 88/15 | 106293.2/[4782.3-5623.8] | 965 |
| MC → SA | 84/14 | 112083.3/[4589.6-5324.7] | 953 |
| GD | 144/51 | 130289.2/[5185.0-5672.9] | 11 |

Fig.13

SIMILARITY-EXTRACTION FORCE-ORIENTED FLOOR PLANNER

BACKGROUND OF THE INVENTION

1. Field of the Invention

The present invention relates to a method of making an integrated circuit having data path modules displaying a regularity or repetitiveness in the integrated circuit, the method including floor planning the integrated circuit according to an iterative process having as inputs a first approximation of electrical pin ordering and number of slices (nodes with branches) for the integrated circuit, and including the extraction of similarity information concerning the locations and associations of the data path circuit cells of the integrated circuit. The resulting floor plan for the integrated circuit minimizes the number of open nets in the interconnections of the integrated circuit while also greatly reducing the amount of computer time required to complete the floor plan.

2. Related Technology

As application-specific integrated circuits (ASIC's) become larger, approaching and exceeding 200,000 cells, the burden of laying out or floor planning these integrated circuits becomes extremely great. Trying to floor plan such integrated circuits without the use of a hierarchy is extremely difficult and is not advisable for two reasons. First, the storage (memory) and computing burden grow non-linearly with the increase of the design size. Secondly, integrated circuits which have been laid out with a hierarchical approach display improved performance. Accordingly, a building-block type approach to floor planning complex integrated circuits is favored, which includes a top-down and bottom-up approach. The top-down aspect of floor planning includes a global assignment of electrical connection pins and feed-through connectors, while the bottom-up aspect includes laying out modules separately at a reasonable size after partitioning. Finally, a routing of the macro cells is applied to finish the layout.

In the computer-aided design (CAD) ASIC industry, there are several existing approaches to the layout of circuit modules, and which extend in some case to the lay out of entire integrated circuits. Min-cut, force directed techniques, simulated annealing, and quadratic programming algorithms such as "Proud", and "Gordian", have been advanced. Some of these focus on the connections necessary within the integrated circuit between the cells of the circuit. Some are addressed to a single hierarchical level of the integrated circuit, and optimize only that level of the circuit. Most generally, the optimized level is the top level of the circuit. Some of these layout planners have as an advantage the minimizing of the interconnecting wire length in the circuit on a global basis. Others equalize the interconnection wire lengths at the expense of greater global wire lengths in order to level connection times (prevent timing discrepancies) within the circuit. However, these conventional approaches focus on general designs of integrated circuits, and are based on connectivity or electrical interconnections between cells and other circuit elements within the integrated circuit.

However, some integrated circuits include data path modules and are more or less rich in these data path modules. Data path modules have a two-dimensional repetitive structure which lends a regularity to an integrated circuit including such data path modules. A few algorithms have been proposed for placing data path modules on integrated circuits taking advantage of some aspect of the regularity of the circuit structure. W. K. Luk and A. A. Dean, in their paper entitled, "Multi-stack Optimization for Data-Path Chip (Microprocessor) Layout", IEEE Proc. of Design Automation Conf., 1989, pp. 110–115, proposed a multi-stack optimization for laying out or floor planning integrated circuit chips including data path modules. This method employed a modification of the min-cut algorithm to partition cells of the circuit structure into stacks while maintaining approximately equal heights for the several stacks. Cells are then swapped or exchanged among the several stacks to improve the overall placement of cells in the circuit floor plan.

An aspect of extraction of regularity information from the functional design of an integrated circuit was proposed by M. Hirsch and D. Siewiorek, in their paper entitled, "Automatically Extracting Structure from a Logical Design", IEEE Proc. of Int. Conf. on CAD, 1988, pp. 456–459. However, the floor plan of the integrated circuit used only pre-placed cells as seeds around which the remainder of the circuit was grown using connectivity information.

More particularly, data path modules have a repetitiveness to their structure as presented in the total context of an integrated circuit. The data path modules have a two-dimensional nature to their circuit structure, and large fan-out nets of control connections to other cells of the integrated circuit. On these fan-out control connection nets, the cells are topographically and logically the same. In other words, in such an integrated circuit, the fan-out control nets with data path modules effectively repeat a slice structure of the circuit. A repetitive node with repetitive and duplicated branches is seen within the integrated circuit as a result.

The mere idea of extracting cells on such control nets into a macro was proposed by G. Odawanre, T. Haraide, and O. Nishina, in their paper entitled "Partitioning and Placement Technique for CMOS Gate Array", presented to the IEEE Transactions, May 1987, vol CAD6, No. 3, pp 335–363. However, the particulars of the use of such a macro was not developed as herein set forth.

SUMMARY OF THE INVENTION

In view of the deficiencies of the conventional technology for making integrated circuits, including methods for floor planning the integrated circuits, the present invention has as its primary object the provision of a method of making an integrated circuit including the steps of extracting from a functional plan of the integrated circuit regularity information about data path modules of the integrated circuit, using the regularity information in view of connectivity requirements within the integrated circuit to place on a floor plan of the integrated circuit the data path modules, and making the integrated circuit according to the resulting floor plan.

An additional object for the present invention is to provide a method of making an integrated circuit having data path modules of data path cells, including the steps of establishing a cell-space matrix for the floor plan having rows and columns, the columns being of uniform width generally matching that of the data path modules and the rows being of variable height to cooperatively define an array of cell spaces, assigning one or more of the data path cells to each of the cell spaces to complete a floor plan for the integrated circuit, and making the integrated circuit according to the floor plan.

Additionally, the present invention has as an object the provision of a method of making an integrated circuit including data path modules, and including the steps of floor planning the integrated circuit by extracting such regularity information from the functional plan of the integrated circuit according to a location macro which includes cells of like topographical configuration which are connected by the same connection net at the identical connection of each of the cells; and according to an association macro which includes cells of like topographical configuration which each connects only to a corresponding one cell in one or more other location macros, or other such set of cells.

Still further, an object for this invention is to provide such a method of making an integrated circuit which includes the steps of extracting the regularity information from the functional plan for the integrated circuit in the form of location macros and association macros, and sorting the macros according to a connectivity requirement of the integrated circuit by use of, for example, a force-oriented or simulated annealing sorting protocol.

Additionally, it is an object for the present invention to provide such a method of making an integrated circuit which further includes the steps of making an initial placement of the data path modules on the floor plan, conducting a connectivity-based force-oriented or simulated annealing sorting of the initially-placed data path modules, according to a weighted initial placement strategy.

Further, it is an object for the present invention to provide such a method of making an integrated circuit which includes a three-level connectivity-based iterative sorting of the cells in the integrated circuit, according to a force-oriented or simulated annealing iterative relaxation protocol, for example.

Accordingly, the present invention provides a method of making an integrated circuit including the steps of floor planning the integrated circuit by extracting from a functional plan of the integrated circuit regularity information about data path modules of the integrated circuit, organizing into macros the regularity information according to location of the cells of the data path modules on common connection nets, similarly organizing the regularity information according to associations of the cells of data path modules exclusively with another cell of a location macro or other similar set of cells, and making an initial placement of the data path cells on a floor plan of the integrated circuit using such location and association macros.

BRIEF DESCRIPTION OF THE DRAWINGS

FIGS. 11, 12, and 13 are respective tabulations of floor planning results obtained using the method of the present invention in comparison with corresponding results obtained using identified conventional floor planning methodologies on the identical problem statement.

DESCRIPTION OF THE EXEMPLARY PREFERRED EMBODIMENT OF THE INVENTION

Figure 1:
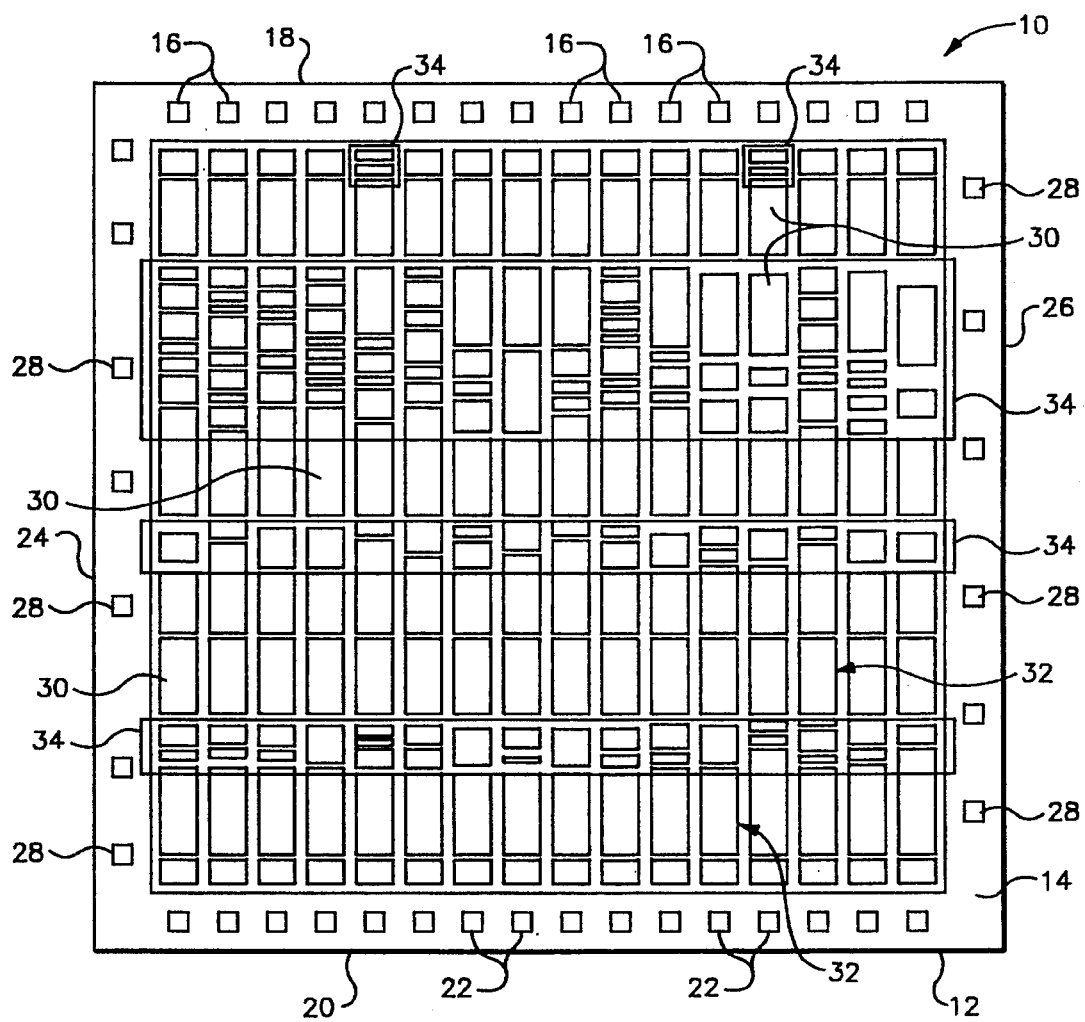
FIG. 1 provides an example of a functional floor plan for an integrated circuit displaying an overall columnar topology and embodying the present invention.

Viewing FIG. 1, a representative exemplary integrated circuit 10 is depicted in functional plan view. That is, the view of FIG. 1 does not depict the actual structures of the multitudes of small-scale integrated circuit elements, and interconnections of these elements, which would appear on and under the surface of an actual integrated circuit if the circuit were viewed under a microscope. The depiction of FIG. 1, on the other hand does depict areas or fields within which such small-scale integrated circuit elements are formed to perform certain functions within the circuit as a whole. The areas or fields seen in FIG. 1 are topological representations of the areas where the small-scale physical circuit features will be formed during actual manufacture of an integrated circuit according to the invention.

Viewing FIG. 1, the integrated circuit 10 includes a semiconductor substrate 12 having a surface 14 upon which is carried a row of electrical input connector pads 16 adjacent to the top edge 18 of the integrated circuit 10. Also, adjacent to the bottom edge 20 of the circuit 10, a row of electrical output connector pads 22 is located. Adjacent to left and right side edges 24, and 26 of the integrated circuit 10 are located plural power supply, ground, and command or control electrical connector pads, which are individually all referenced with the same numeral 28.

Still viewing FIG. 1, it is seen that the integrated circuit 10 includes various kinds of corresponding vertically-extending, or columnar, integrated circuit element functional blocks or modules, generally referenced with the numeral 30, and each extending between and electrically connecting to an input connector pad 16 and a corresponding output connector pad 22. The columnar modules 30 are generally of the same width, and are lined up vertically between the connector pads 16 and 22, and are also vertically spaced closely together on the surface 14 so that virtually continuous columns 32 of small-scale circuit elements extent between the connector pads 16 and 22. The small-scale integrated circuit elements of the modules or function blocks 30 are connected electrically to one another, as is well understood. Also, various ones of the function blocks 30 in each column 32 may be electrically connected to one another and to other function blocks in the same or another column 32 by one or a plurality of conductive traces (not shown) formed on or beneath the surface 14 of the integrated circuit 10. Understandably, the multitude of electrical connections which must be formed among the plurality of integrated circuit function blocks 30 of the circuit 10 also demands some space topographically, morphologically (that is, in the depth dimension of the integrated circuit beneath the surface 14), or both, on or beneath the surface 14 of the integrated circuit 10.

As those ordinarily skilled in the pertinent arts will understand, the integrated circuit 10 is made to implement a functional plan for the integrated circuit which has been designed by a circuit logic planner to achieve a certain objective with the integrated circuit 10. That is, some human planner, will with the assistance of analytical, empirical, and intuitive tools, as well as personal experience and judgement, select and organize various circuit functional elements to achieve a certain overall function with the circuit 10. Having arrived at a scheme for relating various circuit functions to achieve the overall functional plan for the integrated circuit, the circuit designer is left with the very difficult job of floor planning or laying out the placements and interconnections of these functional units on an actual integrated circuit so that the circuit can be successfully realized at a reasonable cost.

The resulting functional plan for the integrated circuit 10 may be expressed conventionally as a hierarchy of functions arranged according to their relationship from the highest overall function for the chip itself progressively to the lowest elemental function within each function block or module 30. That is, the integrated circuit may be represented as a plurality of functional hierarchies, each representing a progressively greater level of functional abstraction from the most general function performed by the chip to the most specific function performed within elemental circuit elements such as particular logic or memory gates of the chip. Conventionally, this functional hierarchy is arranged according to a "parent", and "child", conceptual organization scheme. That is, each parent function at a certain level of the hierarchy may be represented as an aggregation of its children's functions performed at lower (and more specific) levels of the hierarchy. For example, a microprocessor at a particular level of the hierarchy may be defined as the aggregation of a series of registers, a buss, and various other functions at lower levels of the hierarchy. Each child function may thus itself be a parent function and have its own children. Each child function which is not also a parent function is considered a terminal function. Each such terminal function is connected to at least one other terminal function, the connections from each terminal function to one or more terminal functions defining a connection net for that terminal function. A series of connection nets are thus defined within the integrated circuit 10, which is commonly referred to as a net list.

Additionally, as may be seen by viewing the surface of integrated circuit 10, outside of the rectangular frames 34 enclosed by dashed lines (which will be further explained), the circuit 10 includes a considerable amount of repetitive structure, both in the sense of functional blocks 30 in the columns 32, and in the sense of functions performed in the functional blocks 30 in view of their interconnections and associations in the functional plan for the integrated circuit 10. Particularly, considering a functional plan for an integrated circuit, such as the circuit 10, one will find blocks or modules of functionality which are repetitive and lend a regularity to the structure of the integrated circuit. This repetitive nature and regularity may be seen visually on the exemplary integrated circuit 10 by noting that outside of the dashed line frames 34, the circuit 10 has many functional features in common among the several columns 32.

More particularly, integrated circuits, such as the exemplary integrated circuit 10 and others, include repetitive functional units which may be identified as so called data path modules. Various integrated circuits are more or less rich in these data path modules. Data path modules characteristically have a two-dimensional repetitive structure which lends a regularity to an integrated circuit including such data path modules. In order to sort the data path modules from the other elements and features of an integrated circuit, definitions may be applied, as follows:

1) A "topocell", is a topology of a functional cell in terms of the electrical circuit elements, external connection features such a connector pads or pins, interconnection features such as wires or conductive traces, and other topological features of the cell;

2) A "location macro", is a set of cells which have the same topocell, and are connected by the same control connection net at the identical connection pin or pad of each topocell;

3) An "association macro", is a set of cells which have the same topocell, and each cell connects only to a corresponding one cell in one or more other location macros, or other such set of cells;

4) A "data path cell", is a cell in any location macro or association macro;

5) A "random logic cell", is any cell not in a location or association macro;

6) A "slice number", for a location macro is the number of cells in that location macro;

7) A "data path module", is a grouping of cells which consists mostly of data path cells; and 8) A "cell-space matrix", is an placement of cells in an array, or grid of rows and columns (the columns having a uniform width, and the rows having a variable height), covering an area; and admitting of more than one cell in each slot (or area sub-unit) of the matrix. To avoid confusion herein, the cells of the cell-space matrix (area subunits) are referred to sometimes as "slots", so that the electrically functional circuit cells are not confused with topological area cells.

Extracting Location Macros

Figure 2:
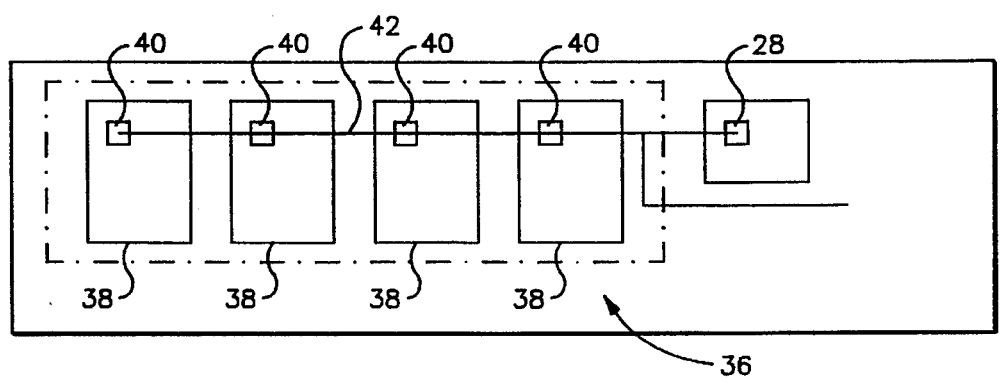
FIG. 2 is a schematic graphical representation of a single location macro extraction from a functional plan for a simplified integrated circuit.

Viewing now FIG. 2, a singular exemplary location macro 36 for a simplified integrated circuit is graphically illustrated. The exemplary location macro 36 includes four data path cells 38, each having the same topocell, or topology for the physical structure which will electrically implement a functional element present in the functional plan for the integrated circuit. Each of the cells 38 is connected at the identical connection pad 40 to a control connection net 42. The control connection net 42 extends to an exemplary control connection pad 28. Consequently, the location macro 36 as seen in FIG. 2 is a graphical association (which may be mathematically expressed as a set), or nexus at a particular hierarchical level, between certain ones of the functional elements expressed in the functional plan for the integrated circuit and the physical structures necessary to implement the functional elements.

An actual functional plan for an integrated circuit will include a multitude of functional interconnections of the modules or functional units of the circuit. Consequently, such an actual integrated circuit design will result in a multitude of location macros being generated or derived from the functional plan for the circuit.

Extracting Association Macros

Figure 3:
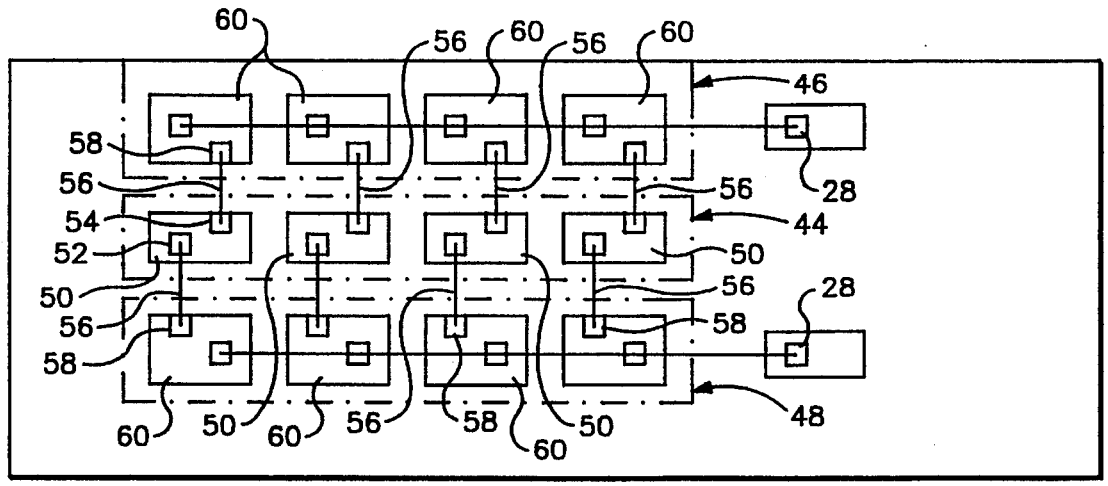
FIG. 3 is a schematic graphical representation of a single association macro extraction from a functional plan for an integrated circuit.

Next viewing FIG. 3, an association macro 44 is depicted along with its connections to two location macros 46 and 48. The association macro 44 includes four data path cells 50 each having the same topology, including a pair of connector pads 52 and 54. Each data path cell 50 connects via a conductor 56, which will likely be a conductive trace in the physical implementation of an integrated circuit, to an associated connector pad 58 on an corresponding one of the cells 60 in the location macros 46 or 48. Again, as with the location macro of FIG. 2, the association macro 44 of FIG. 3 is a graphical association (which may be mathematically expressed as a set), or a nexus at a particular hierarchical level, between certain ones of the functional elements expressed in the functional plan for the integrated circuit and the physical structures necessary to implement the functional elements. An actual integrated circuit design will also result in the generation of a multitude of such association macros.

Iterative Connectivity-based Sorting of Macros

Figure 4:
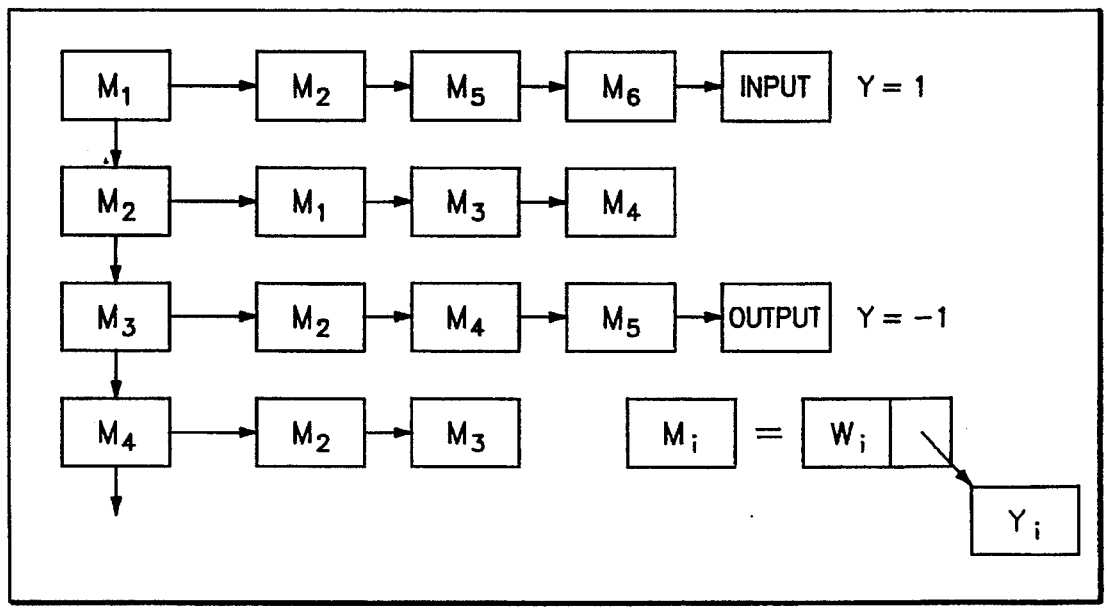
FIG. 4 provides a graphical depiction of a iterative connectivity-based sorting of macros extracted from a functional plan for an integrated circuit.

Turning to FIG. 4, a graphical depiction is provided of a iterative connectivity-based sorting which is next conducted among all of the location and association macros which are built up for an entire integrated circuit as explained with respect to FIGS. 2 and 3. Referring back to FIG. 1, it will be recalled that the input connector pads 16 are conventionally considered to be at the top of the integrated circuit, and that the output connector pads 22 are at the bottom. This convention is followed in the connectivity-based iterative sorting with the input pads assumed to be at a coordinate location of Y=0, and the output connector pads being at Y=−1. Because the columnar structure seen in FIG. 1 is assumed to prevail, as opposed to a rectangular area arrangement or some other form of dominant topology, the X coordinates for the macros are ignored at this stage of the floor planning.

The iterative connectivity-based sorting among location and association macros is initialized with Y=0 for all of the macros, and is conducted according to the connectivity requirements among the macros as derived from the functional plan for the integrated circuit either using a force-oriented protocol, or another method, such as simulated annealing. For example; if $M_i$ is a macro i out of n macros; and $M_i$ is the Y coordinate displacement from Y=0 of the macro $M_i$; and if $Y_i$ and $\bar{Y}_i$ are the new and previous Y coordinates of $M_i$ after and before an iterative move of the macro $M_i$; and if $W_{ij}$ is the number of connection nets connecting $M_i$ and another macro $M_j$; then for all macros $M_j$ connecting to $M_i$ the following relationship exists:

$$Y_i = \frac{(\Sigma_j W_{ij} \times Y_j)}{\Sigma_j W_{ij}}$$

$$M_i = |Y_i - \bar{Y}_i|$$

$$D = \text{Max}\ (m_1 + m_2 + \ldots m_n)$$

An iterative step involves moving the macro Mi to a new location in the Y direction to a new coordinate yi, and calculating mi. All of the macros are visited in each iteration in order to calculate a value for D. A ceiling for D is set at the beginning so that the iteration is stopped when it first results in a D value less than the preset ceiling value. Accordingly, all of the data path cells have provisional Y coordinates set for them by this initial sorting step.

Initial Placement and Global Connectivity-based Weighted Sorting of Data Path Cells Because there is usually a strong and orderly parallel flow of signals from the input pins at the top to the output pins at the bottom of a data path module, it is common practice to place these pins at opposite sides of the topology of such modules. The ordering of pin connections is important because cell locations are determined using connectivity-based iterative processes, and these input and output pins are evenly distributed on the respective sides of the integrated circuit topology. Also, given a particular integrated circuit and data path module design, it is not difficult to initially select a slice number or number of cells in each macro as a determinate of the topology of the integrated circuit. These slice numbers serve as a starting point for further iterative refinement of the slice numbers by application of the present floor planner. Alternatively, an algorithm may be used to select an initial slice number for further refinement through the floor planning process as herein disclosed.

Figure 5:
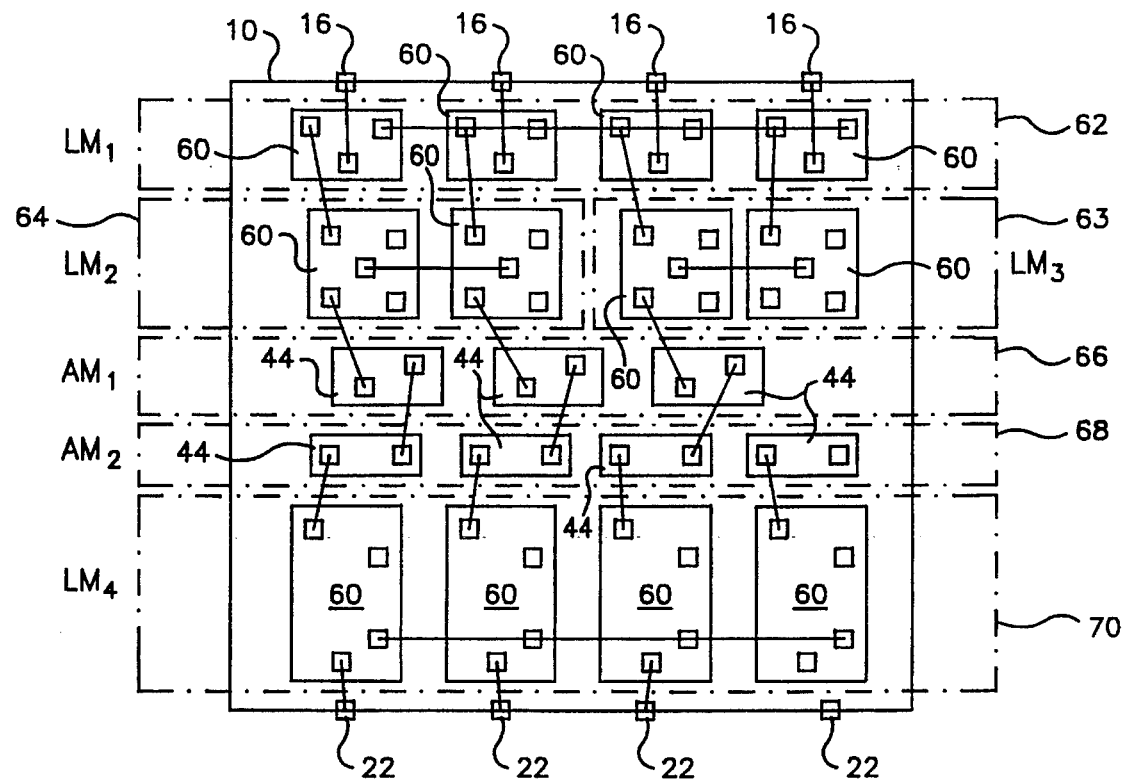
FIG. 5 is a simplified schematic illustration of an initial floor plan for an integrated circuit which will be further revised according to aspects of the present invention.

With an initial pin ordering and slice number as a starting point for further refinement, data path cells are initially placed. FIG. 5 graphically depicts the result of such an initial placement followed by a connectivity-based position sorting as is described below. A connectivity-based iterative sorting similar to that conducted with the macros is conducted on a global basis using data path cells as the iterative unit. However, the usual connectivity-based sorting is bi-directional. That is, conventionally, all of the cells on a connection net are cognizable to all of the other cells so far as influencing the iteration process is concerned. In other words, all of the cells on all of the connection nets contribute equally to the summation of connection lengths which are compiled with each complete path of the iteration, and influence the resulting relocation of cells and future iteration passes in this way.

However, a weighted connectivity-based iteration for initial placement of the cells is preferable. First, a weighing factor is applied to each connection net which is inversely proportional to the number of pins in the net. Secondly, a special asymmetrical weighing strategy is implemented with respect to control connection nets. That is, all of the cells on a control connection net are invisible to (make no numerical contribution to a summation of electrical connection lengths with respect to) a data path cell on the net. Also, all of the cells on a control connection net are fully visible (make a contribution to a connection length summation) with respect to a random logic cell on the net.

One of the well-known problems using a force-model of cell placement is the severe cell overlapping. The data path weighing of the present method is extremely useful in spreading out the cells on high fan-out control nets. The stopping criteria for the iterative process is similar to that described above with respect to the sorting of macros. That is, a pre-selected ceiling is set and the iteration stops when a summation value for the interconnection lengths is obtained which is less than the ceiling value.

FIG. 5 shows that the resulting topology places location macros 62, 63, and 64 adjacent to one another with location macro 62 connecting with the input connection pads 16. Next, two association macros 66 and 68 are placed, followed by another location macro 70 connecting with the output connector pads 22.

Macro Merging

The number of cells in each macro may be very different. With a given number of columns in the integrated circuit, a cost function is used to determine which macros are grouped together to form rows across the topology of the integrated circuit. The cost function includes three terms. $S_r$ is a percentage of empty space in the topology if two particular macros are merged into a row. C is the strength of the interconnection between two macros. That is, C is the actual number of conductors connecting the particular macros. Y is the average vertical (Y direction) distance between two particular macros to be merged. $W_1$, $W_2$, and $W_3$ are user-selected weighing factors for each of the variables present in the particular macros. The cost function is:

$$\text{Cost} = (W_1 \times Y) + (W_2 \times S_r) + (W_3 \times C)$$

The macro merging may be performed on a one-pass basis from the top macro (adjacent to the input pins 16) to the bottom macro (at the output pins 22). In other words, a step-wise macro merging is conducted from top (input pins) to bottom (output pins) of the topology of the integrated circuit, calculating at each step the cost for each possible macro merge among the remaining macros, and effecting the merge of minimum cost, provided that the total cell count after merging is less than the number of columns in the topology.

A macro not merged with other macros becomes a row on the integrated circuit topology. From this point on in the following description with respect to the simplified topology depicted in FIGS. 2–10, it is assumed that every row of the topology will contain one macro in the rough cell-space matrix after macro merging, and which cell-space matrix will be regularized in the following step.

Assigning Data Path Cells into a Cell-Space Matrix

Figure 6:
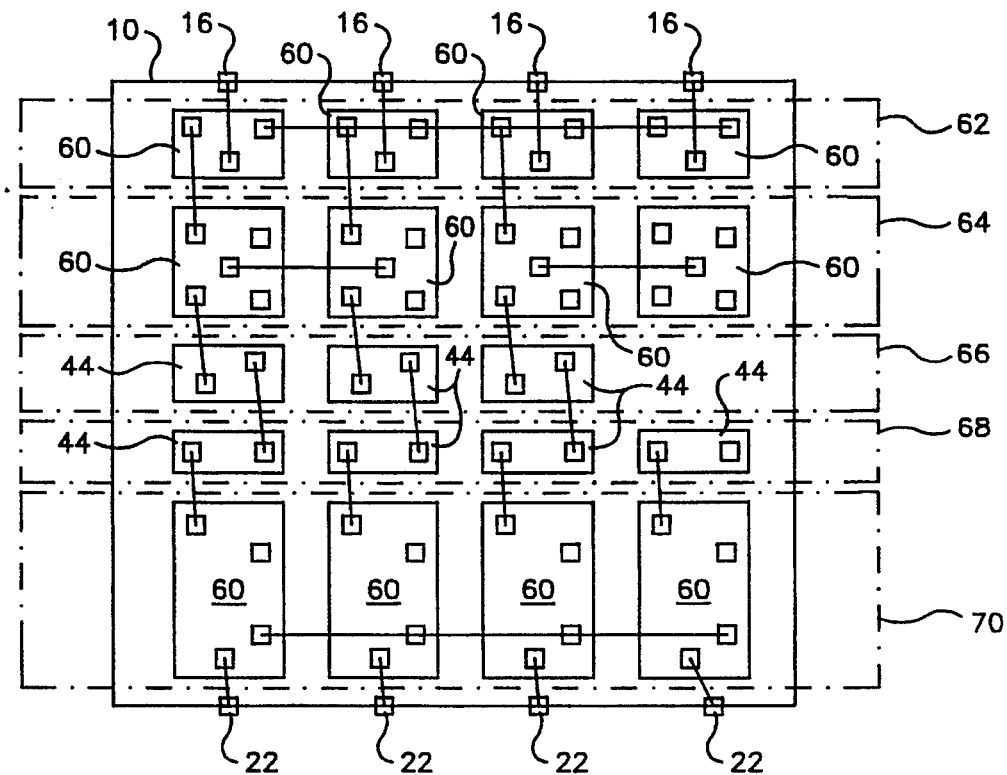
FIG. 6 provides a next-iteration simplified schematic illustration of an integrated circuit floor plan revised from the initial floor plan of FIG. 5 according to one aspect of the present invention.

After the macro merging, almost all of the macros have similar numbers of data path cells. Also, the X and Y coordinates for the data path cells are fair to good approximations of where the cells should be located topologically, ignoring for the most part to this point in the process the space needed for the random logic cells of the integrated circuit. Assigning the data path cells into a regular cell-space matrix simply regularizes the rows and columns topology of the floor plan so far developed. It will be noted that each of the columns has a width substantially equal to the uniform width of the modules, and that the rows have a variable height to cooperatively define an array of "slots", or cell-space areas on the topology of the integrated circuit. The term "slot" is used synonymously with "cell space", but is used to distinguish these cell spaces from the cells of functional electrical circuitry which are assigned to the topological cell-spaces as the floor planning progresses. Each of the cell spaces or slots of the cell-space matrix may accept one or more cells. FIG. 6 shows the result of assigning the data path cells seen in FIG. 5 into the cell spaces of a regular cell-space matrix.

Placement of Random Logic Cells

Figure 7:
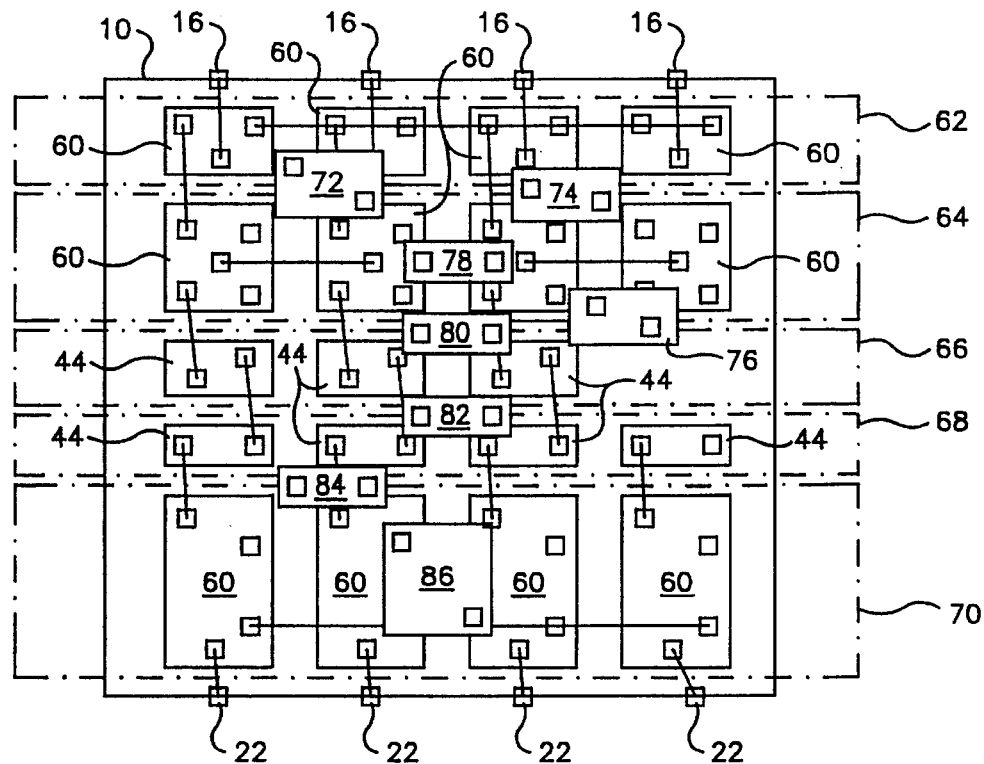
FIG. 7 is a next-succeeding-iteration simplified schematic floor plan for an integrated circuit revised according to an aspect of the present invention.

To this point in the floor planning process, some cognizance has been given to the connection requirements for the random logic cells of the integrated circuit. However, no attention has been given to space on the topology of the integrated circuit for these random logic cells. For the majority of data path module circuit designs, the percentage of random logic cells should be low compared to the percentage of data path cells. In order to initially place the random logic cells, a global connectivity-based iteration is conducted as an overlay to the already placed data path cells, and without allowing the placement of the data path cells to change. A force-oriented approach, or simulated annealing approach, for example, may be used to effect this initial placement. FIG. 7 shows the result of such an initial placement. This Figure shows random logic cells 72–86 overlaid on the simplified topology of the integrated circuit as developed and previously presented in FIG. 6.

Allocation of Random Logic Cells into Empty Spaces of the Cell-Space Matrix

With any provisional topology developed for an integrated circuit to this point in the floor planning process, there may be some empty spaces or slots in the cell matrix. To the extent possible, random logic cells are allocated to these empty cell matrix slots on a closest-location basis, provided that placement of a particular random logic cell into a particular slot of the cell-space matrix does not cause a vertical enlargement of the slot. Such a vertical enlargement of the cell-space would necessarily increase the height of the row and extend across the matrix to cause wasted topographical space in the other columns crossed by the row. As will be seen, in the simplified topology illustrated in FIG. 7, random logic cell 76 will be assigned to the empty space in column 4, row 3.

Creating New Columns/Rows in the Cell-Space Matrix for Random Logic Cells

The remaining random logic cells not assigned to a cell matrix slot by the previous step in the floor planning process must find a space on the final integrated circuit topology. That is, random logic cells 72, 74, and 78–86 can not in fact overlay the other cells of the integrated circuit as seen in FIG. 7. The topology of the circuit must be expanded to accommodate these random logic cells. This expansion can be in the form of an added row or rows, or in the form of an added column or columns. However, the decision between creating this additional space as a new row or rows, and creating the new space as a new column or columns is made based on a comparative evaluation process with respect to the unassigned random logic cells. The evaluation process looks first for a minimum summation of X or Y coordinates for the unassigned random logic cells. If the minimum summation is for the X coordinates (narrower in the horizontal dimension), then a new column or columns will be added to the cell-space matrix. On the other hand, it the minimum summation is for the Y coordinates (narrower in the vertical direction), then a new row or rows will be added to the cell-space matrix.

If the decision is to add a new row or rows to the cell-space matrix, the comparative evaluation process for rows includes the steps of:

1) Sorting into a list the remaining random logic cells by Y coordinate (that is, by location from the top of the cell-space matrix, ignoring the X coordinates of the cells);

2) Partitioning the list into a set of sub-lists such that the total cell height in each sub-list is approximately equal to the maximum cell height in the sub-list multiplied by the number of columns in the cell-space matrix;

3) Merging the last two sub-lists because the last sub-list will likely contain fewer cells than the number of columns in the cell-space matrix;

4) Sorting each sub-list according to the X coordinates of its member cells (that is, ordering the cells in each sub-list according to their X coordinates horizontally across the cell-space matrix);

5) For a first sub-list, taking the mean value of all Y coordinates of cells in the sublist and inserting a new row of zero-based height between the two closest rows of the cell-space matrix, and assigning cells into the resulting matrix slots of this new row according to the following step;

6) Iteratively trial-fitting cells from the first sub-list into the new row which initially has a zero-based height enlarged initially only to a value "H", which is less than the median-height value of the sub-list, but which is high enough to accept a first cell from the sub-list; trial fitting the remaining cells from the sub-list into the new row of height "H" (one or more cells to a slot) until all of the cells are fitted into the new row; or until the row is filled and one or more cells remain in the sub-list. If any cells remain in the sub-list when the row is full, then increment the value "H" by an incremental amount "h", and repeat the trial fitting from the beginning until all cells from the sub-list are fitted into the new row; and 7) Repeating steps 4 and 5 until all of the remaining random logic cells are assigned to new rows of the cell-space matrix.

On the other hand, if the decision is to insert new columns into the cell-space matrix, the following steps are implemented:

1) Sorting into a list the remaining random logic cells by X coordinate;

2) Determining the number of new columns to be inserted into the cell-space matrix by dividing the total height of the cells in the list by the column height of the cell-space matrix;

3) Partitioning the list into sub-lists such that every sub-list has a total cell height approximately equal to a target cell height, the target cell height being the total cell height in the list divided by the number of new columns to be inserted into the cell-space matrix;

4) Sorting each sub-list by Y coordinates of the cells in the sub-list;

5) For a first sub-list, taking a mean value for all of the X coordinates of the cells in the sub-list, and inserting a new column in the cell-space matrix at the closest location between two other columns;

6) Inserting the cells from the sub-list into the slots of the new column, and incrementing the number of columns in the cell-space matrix by one;

7) Repeating steps 5 and 6 until all of the remaining random logic cells of the remaining sub-lists have been inserted into the cell-space matrix in new columns.

Figure 8:
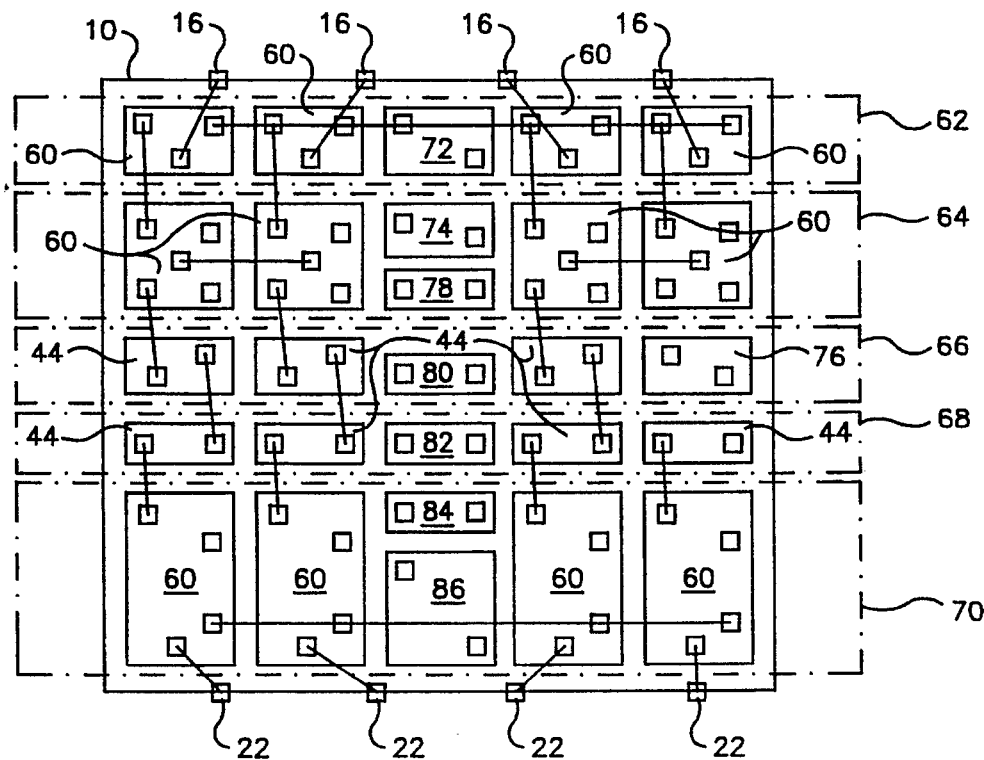
FIGS. 8, 9, and 10 provide successive next-iteration simplified schematic floor plans for an integrated circuit, each revised from the prior iteration according to respective aspects of the present invention.

FIG. 8 graphically illustrates the result of this comparative evaluation process, and the addition of a new column to the exemplary simplified integrated circuit topology which was illustrated in FIG. 7. FIG. 8 shows that the random logic cells 72, 74, and 78–86 have been assigned to a new column 3, which has been inserted between old columns 2 and 3.

Returning to a consideration of FIG. 1, a comparatively more complex integrated circuit topology is illustrated. This topology is for the integrated circuit further considered with respect to FIG. 13. Those ordinarily skilled in the pertinent arts will recognize that this topology is not as complex as that for an ASIC or other integrated circuit with 100,000, or 200,000 cells, for example. However, this topology is representative of the results which may be obtained by use of the present invention, and the present invention extends to integrated circuits of any size. Viewing FIG. 1, the dashed-line frames 34 denote new inserted rows of random logic cells created by the floor planner of the present invention. Within these frames 34, the random logic cells are well fitted to use the topological space. It will be noted that outside of the dashed-line frames 34, the data path cells of the integrated circuit are arranged to substantially completely fill the topological space. Overall, the data path cells and random logic cells are arranged in rows and columns in a topological cell-space matrix having columns of uniform width, rows of variable height, and with each slot or cell-space of the matrix accepting one or more of the functional circuit element cells of the integrated circuit.

Cell Flipping

The total global interconnection conductor length in the integrated circuit may be reduced simply by flipping some cells in the topology about a horizontal axis top to bottom.

To determine which, if any, of the cells should be flipped, and in which direction, the following test is used:

1) Let $P_i$ be the location of a connector pin "i", on a cell;

2) Let $Y_i$ be the mean coordinate of the cell;

3) Let $Y_v$ be the Y coordinate of all of the cells which connect to the subject cell;

4) Set $L_i$ equal to 1 if the location of the connector pin $P_i$ is in the top half of the cell, and equal to −1 otherwise;

5) Set $C_i$ equal to 1 if $Y_v$ exceeds $Y_i$, and equal to −1 otherwise; then

6) "Flip", equals the summation of $L_i$ multiplied by $C_i$.

For each particular cell, if Flip is negative, the cell is flipped vertically from top to bottom. This procedure is conducted with every cell in the matrix, both data path cells and random logic cells.

Figure 9:
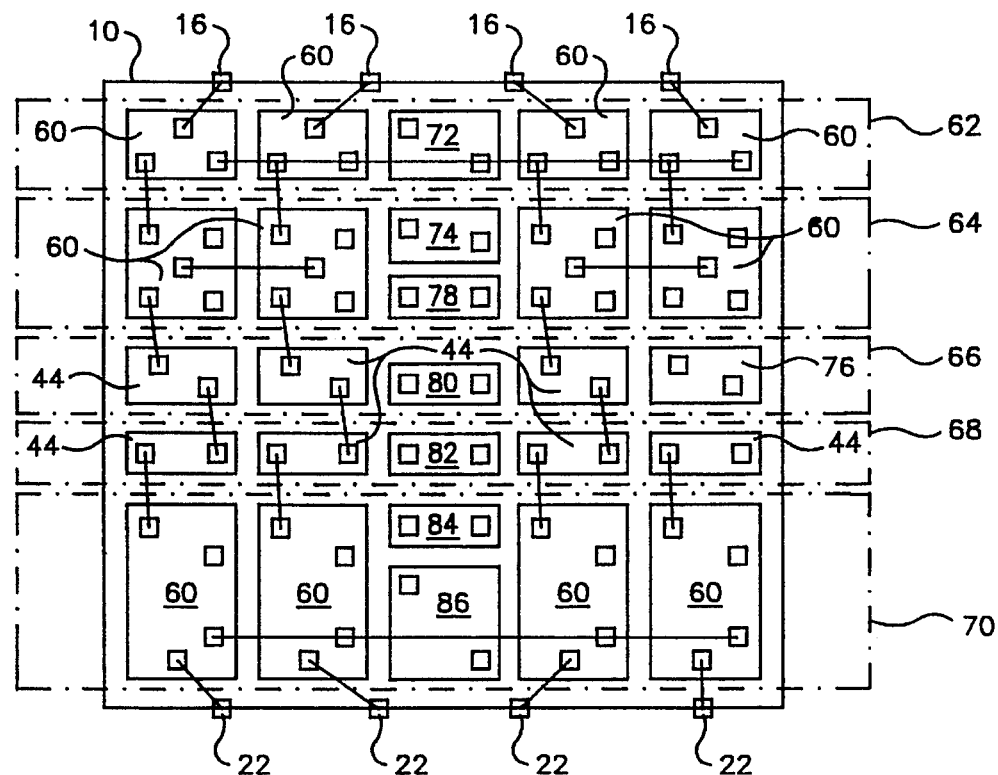

FIG. 9 graphically illustrates the result of this cell flipping in the context of the simplified integrated circuit topology. It is seen that cells in rows 1 and 3 have been flipped vertically.

Estimating Column-to-Column Spacing

Vertical routing of connection tracks is more critical with data path modules than is the routing of horizontal connection tracks. Accordingly, a better allocation of space on the topology of the integrated circuit may be obtained by using a Steiner tree type of routing space monitor for all of the connection nets in the integrated circuit. The final spacing between any two columns of the integrated circuit topology is multiplied by an empirical factor to economize on the actual topological area required for any particular circuit design. Experimentally, the applicants have determined that a factor of 0.8 works well. A similar horizontal connection track routing allowance may be employed. However, the applicants have determined that a horizontal connection track allowance between the rows of cells in an integrated circuit of data path modules is not generally required. This requirement of space for horizontal connection tracks for a particular integrated circuit topology may or may not be present dependent on the mix of random logic and data path cells in the particular circuit.

Determining Exact Pin Locations

Figure 10:
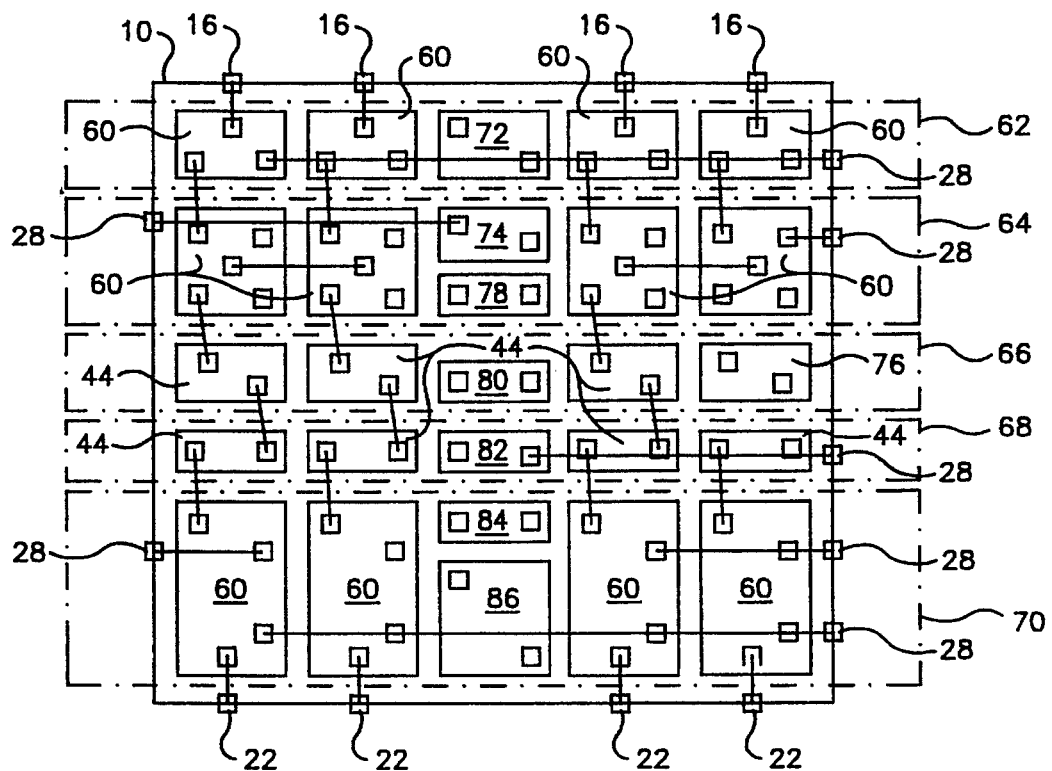

Up to this point, the input, output, power supply, ground, command and control pins, and all other pins were assumed to be in either one of two sets. The input pins and output pins were in the first set, respectively at the top and bottom of the integrated circuit topology. All of the other pins were assumed to be in the second set along the sides of the integrated circuit. For each pin in the first set, the final X coordinate of the pin in a cell to which it connects is set as its final X coordinate. Connector pins in the second set are allowed to find a location either on the left or right side of the integrated circuit. One consideration in this selection of a side for each of the pins of the second set is alleviation of vertical data path congestion in the near-final floor plan of the integrated circuit. For each pin in the second set, the mean X and Y coordinates of each cell connector pad it connects to is calculated. The mean Y coordinate is the final Y coordinate for that pin. The Mean X coordinate simply determines whether the particular pin is placed on the left or right hand side of the integrated circuit. FIG. 10 graphically depicts the result of this final pin placement on the simplified integrated circuit topology.

Comparative Results

FIGS. 11, 12, and 13 present tabulations of results achieved with the floor planner of the present invention in comparison with floor planning results achieved with several conventional floor planning methods on particular designs of integrated circuits. The results for the present invention are identified with the acronym "SEFOP", standing for "similarity-extraction force-oriented (floor) planner". That is, the iterative methods based on connectivity were performed using a force-oriented, rather than simulated annealing or another type of relaxation scheme. It will be understood that these other types of iterative connectivity-based relaxation schemes can also be used with the present invention.

In the tables of FIGS. 11–13, the acronym "GD", stands for Gordian with quadratic objective function and matrix pre-conditioning, while "SA", stands for Simulated Annealing. "MC", stands for Min-Cut without clustering. The same routing and tool set is used to complete the routing for each sample floor plan. "CHR" stands for a fixed channel router, and "CUR" stands for a maze router. Central processing unit (CPU) times are given in minutes on a SUN Sparc II (28.5 MIPS, 4.2 MFLOPS) with 64 Mbyte main memory. Considering the results of FIG. 11, it is seen that the present inventive method produces an integrated circuit floor plan with significantly fewer open nets and in less CPU time. This design includes 512 large data path cells, and 264 smaller random logic cells. During placement of the random logic units SEFOP created two new rows for placement of the cells (recalling FIGS. 7 and 8.

FIG. 12 shows the results with a circuit design having only data path modules. However, only 18 out of 34 macros extracted are location macros. All of the rest of the extracted macros are association macros. Again, the floor planner according to the present invention provides fewer open nets and uses less CPU time.

Finally, FIG. 13 shows the comparative results with a circuit design having a low percentage of data path cells. Only 112 out of 274 cells in this design are data path cells. Noting the GD-SA result of FIG. 12, as well as the result for this method in FIG. 12, and for the MC-SA method of FIG. 13, it is seen that SEFOP does not necessarily result in the shortest global conductor (wire) lengths for each design of circuit. However, the differences in wire lengths are less with SEFOP because this floor planner lines up data connection nets vertically and control connection nets horizontally. Accordingly, SEFOP causes less deviation in timing among the slices of the circuit. This improved timing consistency is critical with data path cells, where timing of control and data communication signals is of great concern. As mentioned, the particular topology for the circuit tabulated in FIG. 13 is seen in FIG. 1.

In summary, the present invention provides an integrated circuit made according to a method which includes floor planning the integrated circuit and making the integrated circuit according to the floor plan. The floor planning is conducted using a basic "skeleton", or lay out scheme, which includes a cell-space matrix of rows and columns, the columns being of a uniform width to match and accept modules of the circuit, the rows being of variable height and cooperating with the columns to define a grid or array of cell-spaces in the cell-space matrix. The cell-spaces of the cell-space matrix may each accept one or more of the functional electrical circuit cells of the integrated circuit. The method of floor planning or setting a specific topology for the integrated circuit includes twelve steps conducted with respect to a functional plan for the integrated circuit, which steps may be broadly stated as follows:

1) Extract data path cells into location macros;
2) Extract data path cells into association macros, (remaining cells are identified as random logic cells);
3) Conduct a connectivity-based (force-oriented) sorting of the macros for determination of initial Y position of the data path cells in a topology;
4) Conduct a connectivity-based (force-oriented) weighted sorting of the macros for initial positioning (initial X position along with initial Y position from step #3) of the data path cells in a topology;
5) Merge the macros selectively using a cost function;
6) Assign the data path cells into a cell-space matrix (making reference to the initial positions of the cells from step 4);
7) Conduct a connectivity-based (force-oriented) initial placement of the random logic cells as an overlay to the initial cell-space matrix assignment of the data path cells;
8) Assign random logic cells into any empty topological space of the cell-spaces of the cell-space matrix;
9) Create new rows or new columns in the cell-space matrix, and assign remaining random logic cells into the resulting new cell-spaces of the cell-space matrix;
10) Flip cells to shorten connector lengths;
11) Establish spacing between the rows and columns of the cell-space matrix; and
12) Set the final connector pin locations for the integrated circuit floor plan.

While the present invention has been depicted, described, and is defined by reference to a particularly preferred embodiment of the invention, such reference does not imply a limitation on the invention, and no such limitation is to be inferred. The invention is capable of considerable modification, alteration, and equivalents in form and function, as will occur to those ordinarily skilled in the pertinent arts. The depicted and described preferred embodiment of the invention is exemplary only, and is not exhaustive of the scope of the invention. Consequently, the invention is intended to be limited only by the spirit and scope of the appended claims, giving full cognizance to equivalents in all respects.

We claim:

1. A method of making, including floor planning a topology for, an integrated circuit having electrical circuit modules of generally uniform width which include electrical circuit cells, said method including the steps of:

establishing a cell-space matrix for the floor plan of said integrated circuit, said cell-space matrix having rows and columns, the columns being of uniform width generally matching that of said modules and the rows being of variable height to cooperatively define with said columns an array of cell spaces;

assigning one or more of said circuit cells to each of said cell spaces;

and making said integrated circuit according to said floor plan, wherein:

said integrated circuit includes modules of data path cells, and also includes random logic cells, said method including the steps of assigning said data path cells into said cell-space matrix on a provisional basis before assigning said random logic cells into said cell-space matrix; and said data path cells are separated from said random logic cells by:
identifying cells which have the same topology;
identifying a first sub-set (macro) of said cells of same topology and which connect to a common control connection net;
identifying a second sub-set (macro) of said cells of same topology which are not cells of said first set and which connect only to a corresponding one cell in said first sub-set; and
identifying as random logic cells which are not in said first or said second sub-sets.

2. The method of claim 1 further including the steps of: first assigning said random logic cells to open cell-spaces in said cell-space matrix following assignment of all of said data path cells into said cell-space matrix;
expanding said cell-space matrix by the creation of either a new row or new column therein, making corresponding new cell-spaces in said cell-space matrix; and
assigning random logic cells which remain in said new cell-spaces of said cell-space matrix.

3. The method of claim 2 further including the step of flipping cells of said cell-space matrix to reduce interconnecting conductor lengths in said floor plan.

4. The method of claim 3 including the additional step of setting exact electrical connector pin locations for said integrated circuit equal to a coordinate location of a connector feature of a cell to which each particular connector pin connects.

5. A method of making, including floor planning a topology for, an integrated circuit, said method including the steps of: extracting into macros from a functional plan of said integrated circuit regularity information about data path cells of the integrated circuit;

using said regularity information in view of connectivity requirements within the integrated circuit to place on a floor plan of the integrated circuit said data path cells; and making the integrated circuit according to the resulting floor plan;

wherein extracting said regularity information includes the step of extracting from said functional plan association macros of data path cells, each macro containing cells all of the same topology and which connect only to a single cell in one or more other macros of cells; the other macros of cells being of the same topology within each macro and all cells in each macro connecting at a topologically identical connection feature to a control net common to that macro.

6. A method of making, including floor planning a topology for, an integrated circuit, said method including the steps of: extracting into macros from a functional plan of said integrated circuit regularity information about data path cells of the integrated circuit;

using said regularity information in view of connectivity requirements within the integrated circuit to place on a floor plan of the integrated circuit said data path cells; and making the integrated circuit according to the resulting floor plan;

wherein extracting said regularity information includes the step of extracting from said functional plan location macros of data path cells, each macro containing cells all of the same topology and which each connect at the topologically identical connection feature to a control net common to that macro.

7. The method of claim 6 further including the steps of:
conducting a first connectivity-based sorting of said macros to determine an initial topological position for the cells in a first coordinate direction;
conducting a second connectivity-based sorting of the macros to determine an initial topological position of said cells in a second coordinate direction;
and conducting a third connectivity-based sorting of cells not in said macros to determine an initial position for said cells in both said first and second coordinate directions.

8. The method of claim 7 further including the step of conducting one of said first, said second, or said third connectivity-based sorting according to a force-oriented protocol.

9. The method of claim 8 further including the step of conducting one of said first, said second, or said third connectivity-based sorting according to a simulated-annealing protocol.

10. The method of claim 7 further including the step of weighing said second connectivity-based sorting.

11. The method of claim 10 wherein said step of weighing said second sorting includes the step of applying a weighing factor to each connection net which is inversely proportional to the number of connector pins in the net.

12. The method of claim 11 wherein said step of weighing said second sorting includes the steps of preventing cells on a control connection net and in a macro from making a numerical contribution to a connection length summation with respect to any other cell on the control connection net which is also in a macro, while allowing all cells on the control connection net to make such a numerical contribution to the connection length summation with respect to cells on the control connection net which are not in a macro.

13. The method of claim 5 further including the steps of conducting a conductivity-based sorting of all cells of the integrated circuit which are not extracted into a macro, and placing said un-extracted cells topologically in said floor plan with respect to said sorting.

14. The method of claim 13 including the step of placing said un-extracted cells into a topological overlay field.

15. The method of claim 14 further including the step of placing said un-extracted cells into vacant spaces of said floor plan on a closest-location basis, provided that placement of any cell into a space of said floor plan does not require enlargement of the space.

16. The method of claim 15 further including the steps of using a coordinate-based weighing of said un-extracted cells which remain to determine the predominant direction of elongation of an initial topological overlay field containing all of said un-extracted cells, and creating a new vacant space in said floor plan parallel with said predominant direction.

17. The method of claim 16 further including the step of assigning said un-extracted cells to said new vacant space on the basis of the order of said cells in a ranking of the cells along a coordinate direction of said floor plan.

18. A method of making, including the floor planning of, an integrated circuit having a functional plan including data path modules of data path cells imparting to said functional plan a regularity of plan, said method including the steps of:

extracting a record of said regularity of plan from the functional plan of the integrated circuit in the form of location macro which include data path cells of like topographical configuration which in each location macro are connected by the topologically identical connection to a control connection net common to all of the data path cells of each location macro; and extracting a record of said regularity of plan from the functional plan of the integrated circuit in the form of association macros which include data path cells of like topographical configuration which each connect only to a corresponding one cell in one or more location macros, or other such set of cells.

19. The method of claim 18 further including the step of sorting the location and association macros according to a connectivity requirement of the integrated circuit functional plan.

20. The method of claim 19 including using one of a force-oriented or simulated annealing sorting protocol to conduct said connectivity-based sorting of said macros.

21. The method of claim 20 further including making an initial placement of said data path cells on a provisional floor plan for said integrated circuit according to a weighted initial placement strategy.

22. The method of claim 21 wherein said weighted initial placement strategy includes the steps of summing connection lengths with respect to data path cells and with respect to cells which are not data path cells, cells on a control connection net which are not data path cells contributing to said summation, while cells on said control connection net which are data path cells do not contribute to said connection length summation.

23. The method of making, including floor planning of, an integrated circuit having data path modules of data path cells, said method including the steps of:

identifying said data path cells into location macros each exclusively including cells of the same topology which each connect at topologically the same connection to a control connection net common to all of the cells in each macro;

identifying into association macros data path cells of the same topology which are not in a location macro but which connect individually at topologically the same connection with one or more cells each of which is in a location macro or other such set of topologically identical data path cells; and conducting a three-level connectivity-based iterative sorting of the cells in the integrated circuit.

24. The method of claim 23 wherein one of said three-level iterative sortings is conducted according to one of a force-oriented or simulated-annealing type of iterative relaxation protocol.

25. The method of claim 24 wherein a first of said three-level iterative sortings of said cells includes said location and association macros and is conducted to determine an initial location of said cells along one coordinate direction of a floor plan for said integrated circuit.

26. The method of claim 25 wherein a second of said three-level iterative sortings of said cells includes said location and association macros and is conducted to determine an initial location of said cells along another coordinate direction of said floor plan for said integrated circuit.

27. The method of claim 26 wherein a third of said three-level iterative sortings of said cells includes cells not in said location or association macros and is conducted to determine an initial location of said cells along both said one and said another coordinate directions of said floor plan for said integrated circuit.

28. The method of making, including floor planning of, an integrated circuit having electrical function cells arranged in a cell-space matrix of rows and columns, said integrated circuit including data path cells which are arrayed in cell spaces of said cell-space matrix, and random logic cells, said method comprising the steps of:

inserting new rows or new columns of new cell spaces into said cell-space matrix; and filling each new cell space only with said random logic cells;

determining whether a new row or new column of new cell spaces is to be inserted into said cell-space matrix by initially positioning said random logic cells as an overlay field of said random logic cells over said cell-space matrix and said data path cells by reference to connectivity of said random logic cells to the latter, determining the height and width of said overlay field of said random logic cells, and inserting either a new row if the width of said overlay field is greater than its height, or a new column if the height of said overlay field is greater than its width.

* * * * *